(12) United States Patent
Faulkner

(10) Patent No.: US 6,197,438 B1
(45) Date of Patent: Mar. 6, 2001

(54) FOODWARE WITH CERAMIC FOOD CONTACTING SURFACE

(76) Inventor: Roger Faulkner, 456 Beulah Ave., Whitman, MA (US) 02382

( * ) Notice: Subject to any disclaimer, the term of this patent is extended or adjusted under 35 U.S.C. 154(b) by 0 days.

(21) Appl. No.: 09/266,443

(22) Filed: Mar. 11, 1999

Related U.S. Application Data

(60) Provisional application No. 60/077,542, filed on Mar. 11, 1998, and provisional application No. 60/093,456, filed on Jul. 20, 1998.

(51) Int. Cl.⁷ .............................. C23C 4/06; C23C 4/10; A47J 27/00; A47J 36/00
(52) U.S. Cl. ......................... 428/627; 428/698; 428/699; 428/908.8
(58) Field of Search .................... 428/698, 699, 428/469, 472, 457, 432, 433, 450, 693, 908.8, 627

(56) References Cited

U.S. PATENT DOCUMENTS

| | | |
|---|---|---|
| 3,895,155 | * 7/1975 | Shukuri et al. |
| 4,341,841 | * 7/1982 | Ohno et al. |
| 4,541,411 | * 9/1985 | Woolf . |
| 5,447,803 | * 9/1995 | Nagaoka et al. |
| 5,879,532 | * 3/1999 | Foster et al. |

FOREIGN PATENT DOCUMENTS

| | | |
|---|---|---|
| 3142312A1 | * 5/1983 | (DE) . |
| 0489914A1 | * 6/1992 | (EP) . |
| 801144A1 | * 10/1997 | (EP) . |
| 401190386A | * 7/1986 | (JP) . |
| 408033573A | * 2/1996 | (JP) . |
| 97/24469 | * 7/1997 | (WO) . |

* cited by examiner

Primary Examiner—Deborah Jones
Assistant Examiner—Jennifer McNeil
(74) Attorney, Agent, or Firm—Mirick, O'Connell, DeMallie & Lougee, LLP

(57) ABSTRACT

The invention consists of improved foodware with a ceramic food contacting surface, which includes cookware, cooking utensils, food serving devices, and utensils for eating food. Such ceramic-coated foodware leaches fewer ionic contaminants into food than prior art foodware. Improved toughness of ceramic coatings on foodware can be achieved via primer or topcoat layers of the tough ceramics aluminum and/or chromium nitride. Ceramic coated foodware based on a plasma-sprayed aluminum alloy substrate is also disclosed, wherein the outermost layer of the plasma spray consists of chromium or a high-chromium alloy, which serves as a substrate for application of the various PVD and CVD coatings of this invention. Ceramic foodware with improved scratch resistance and thermomechanical fatigue resistance is also disclosed, based on a wholly ceramic design, using silicon carbide, or aluminum nitride fired ceramics to form an item of foodware, with a polished food-contact surface. Such wholly ceramic foodware can also be used as a substrate for application of the other vacuum-deposited coatings of this invention to form a variety of foodware with attractive colors. Lightweight ceramic foodware with improved heat transfer properties, high strength, and excellent thermomechanical fatigue resistance, based on carbon-carbon composites, is also disclosed. Ceramic-coated foodware in which a top clear coat of silicon nitride, alumina, or diamond-like carbon is applied for decorative effect (creating a "lacquered" surface appearance) is also disclosed.

8 Claims, 2 Drawing Sheets

NON-WETTING

$\alpha$ = CONTACT ANGLE $\alpha > 90°$

WETTING

$90° > \alpha > 10°$

GOOD WETTING

$\alpha < 10°$

FOODWARE WITH CERAMIC FOOD CONTACTING SURFACE

CROSS REFERENCE TO RELATED APPLICATIONS

This invention is a continuation in part of Provisional applications 60/077,542, filed on Mar. 11, 1998, and 60/093,456, filed on Jul. 20, 1998.

FIELD OF THE INVENTION

This invention relates to foodware with ceramic food-contacting surfaces.

BACKGROUND OF THE INVENTION

The oldest known type of non-stick cookware is oil-seasoned steel or cast iron cookware. Such cookware is very effective, and has a tough, abrasion resistant surface. Unfortunately, seasoned steel or cast iron cookware is vulnerable to damage by rusting of the substrate metal, and must be handled and particularly cleaned with care to avoid damaging the cookware surface. The critical carbonized surface layer can be lost or damaged if the cookware is allowed to sit in water containing dissolved oxygen for even a few hours.

Another problem with seasoned steel or cast iron cookware is that iron can readily be leached from the cookware's surface by food acids, as are found in tomato sauce for example. Thus, depending on one's food preferences, it is possible to get a dose of iron from food cooked in seasoned iron-based cookware which is well above the daily recommended dose, which can have negative health effects for some people.

Another problem with seasoned steel or cast iron cookware is that reaction products of edible fats and oils (the source of the carbonaceous cooking surface), which are chemically modified by the process of seasoning the cookware, can sometimes escape back into food before the carbonization process is complete. Some intermediate compounds which are produced as fats and oils are chemically converted to the carbonized non-stick cooking surface are known carcinogens (such as trans-fatty acids and peroxidized fatty acids).

Another traditional material for foodware is copper. Copper foodware has excellent heat transfer properties, but is much softer than seasoned cast iron or stainless steel, for example. This makes it delicate and prone to scratching. It is also prone to surface oxidation and various reactions with sulfur compounds in food that lead to tarnishing. Similar to cast iron and steel foodware, copper foodware can introduce copper ions into food at fairly high levels compared to dietary requirements for copper. Copper can be polished to an attractive reflective surface finish, but requires constant work to maintain this surface finish. As a result of the difficulty of keeping copper foodware looking good, a large fraction of copper foodware in modern kitchens today is more for show than for cooking.

The difficulty of keeping copper foodware looking good implies that another approach involving a tougher metal which is better able to hold a shine than copper is desirable. One prior art solution for this is stainless steel. Stainless steel foodware is not normally seasoned with oil in the same way as cast iron or steel cookware. Food tends to stick to stainless steel much more than to seasoned cast iron. However, stainless steel foodware is strong and tough, and holds a finish very well (much better than copper). Furthermore, stainless steel foodware can be soaked in strong cleaning solutions, which makes it more clean-able and more convenient to maintain than seasoned cast iron.

Stainless steel foodware holds its shine much better than copper, but can still be scratched by stainless steel utensils, and it can be pitted by salt water (especially hot brine). Stainless steel foodware can also leach ions into food, especially iron, chromium, manganese, and nickel. Although the actual dose of ions from stainless steel is normally quite low, it is still a concern for some people. (Nickel in particular can leach from some grades of stainless steel at levels that are well above the recommended dietary allowance for nickel.)

Aluminum foodware has the best heat transfer properties per unit weight of any commonly available type of prior art foodware. Unfortunately, aluminum foodware is also prone to leaching of aluminum ions into food, in the form of food acid aluminum salts. Such food acid aluminum salts are much more able to enter the bloodstream than common inorganic forms of alumina (as in bauxite) or aluminosilicates (found in clays for example). Some researchers have expressed concern that blood-borne aluminum can accumulate in the brain, and may increase the risk of Alzheimer's disease.

One way to reduce the amount of aluminum getting into food from aluminum foodware is to coat the aluminum. Anodized aluminum is coated with aluminum oxide to a greater depth than is the case for untreated aluminum objects. (Aluminum that has been exposed to air is always coated with a thin layer of oxide; the oxide is much harder and more stable than the aluminum, and passivates the surface to some extent.) Anodized aluminum is much harder on the surface than untreated, air-oxidized aluminum surfaces because the oxide layer is thicker. Anodized aluminum is also far more resistant to leaching of aluminum ions by food acids than untreated, air-oxidized aluminum foodware. The anodized aluminum surface is not good for release of food during cooking, though; oil must generally be used to prevent foods from sticking.

Anodized aluminum foodware surfaces always contain microcracks, due in part to the difference of thermal expansion rate of aluminum versus aluminum oxide, which leads to thermomechanical stress as the foodware (especially cookware) temperature is changed. These cracks are sites for corrosion, and leach aluminum into food. These cracks can also grow, and yet remain undetectable to the naked eye, so that anodized aluminum foodware can leach more aluminum as it ages.

Anodized aluminum is not dishwasher safe. Typical automatic dishwasher detergents, dispersants, and wetting agents discolor and/or corrode anodized surfaces. Anodized aluminum foodware also can be discolored if oily drips get cooked onto the surface and then get hot enough to be carbonized. Such stains are difficult to remove without changing the appearance of the foodware in the region where the oil drip has been cooked onto the foodware, because the carbonized oil stain must be abraded off.

Another way that aluminum foodware can be modified to prevent leaching of aluminum ions into food is via thermal spraying (flame spray, plasma spray, or high velocity oxidizing flame, known commonly as HVOF spray) the inside of the foodware. In thermal spray methods, a hot gas or plasma is used to melt (or partially melt) a stream of solid particles, which are impinged against a relatively cold metal surface (in this case the aluminum substrate foodware) at a sufficient velocity to adhere to the surface. (The impinging molten particles from the plasma spray also cause localized melting of the aluminum surface, which can improve adhesion.)

Thermal spray methods cannot produce a smooth, specular (mirror-finish) surface. The rough surfaces produced are ideal for anchoring a perfluorocarbon layer, but if untreated, are generally prone to food sticking. Look Manufacturing Company's aluminum-core cookware, which are plasma sprayed with stainless steel, are examples of this approach. The resultant surface is very tough, but is not good for release of foods during cooking. (This type of surface does make an excellent substrate for application of perfluorocarbon-based release coatings, though.) Scan-Pan Inc. sells plasma sprayed aluminum cookware that is sprayed with titanium nitride (TiN). This cookware is much better for release of foods during cooking than otherwise similar cookware (in terms of porosity and surface roughness) which has been sprayed with stainless steel, for example. Scan-Pan's TiN surface coating is quite uneven, though the surface roughness is essentially devoid of sharp edges. The TiN is partially decomposed by the plasma's extreme temperature, so that the surface also contains metallic titanium in addition to titanium nitride.

Perfluorocarbon polymers, such as PTFE (polytetrafluoroethylene, "Teflon™" for example), have been used as non-stick coatings for cookware since the 1960's. The earliest technologies for applying such coatings over relatively smooth aluminum cookware produced very fragile cooking surfaces. Since then, these coatings have been improved by incorporating various reinforcing ceramics into the perfluorocarbon polymer layer, as in U.S. Pat. No. 4,795,777 or DuPont's U.S. Pat. Nos. 3,970,627 and 4,123,401 covering their Ironstone™ cookware (in which mica reinforces the perfluorocarbon layer).

Recent improvements of perfluorocarbon-coated cookware have involved anchoring the PTFE or perfluorocarbon polymer layer more durably to the cookware surface via surface roughening. Some of the most advanced techniques involve infiltration of perfluorocarbon polymers or polymer precursors into strong, porous surface layers on the cookware surface. Such rough and/or porous anchoring layers can be applied to the aluminum cookware by several methods, including thermal spray techniques, powder metallurgy, anodizing (see for example U.S. Pat. No. 5,545, 439), and acid or base etching.

When surface roughening is applied to cookware that is subsequently coated with perfluorocarbon polymer release agents, the resultant cookware is not smooth on the cooking surface. The surfaces of such cookware usually contain features that deviate from the average local plane of the surface by more than 10 microns, and usually more than this; see for example U.S. Pat. No. 5,71 1,995 which describes advantages of deliberately rough cooking surfaces for perfluorocarbon-coated cookware. The surface energy densities of the release coatings are so low, however, that excellent food release is attained in spite of the surface roughness. Such coated cookware is designed so that if the surface is scratched, only the (abrasion-resistant) peaks of the substrate cooking surface are exposed by normal abrasion during cooking; most of the cookware surface remains protected by perfluorocarbon polymer release agents (which reside in the surface pores and depressions).

Perfluorocarbon polymers do not release ions into food unless the perfluorocarbon layer is damaged. Perfluorocarbon-coated cookware is easily damaged if hard cooking implements, such as metal utensils, are used to stir or manipulate food while cooking in them. The resultant flakes of perfluorocarbon coating can get into food. Although these perfluorocarbon flakes are not known to cause any health problems, many people object to the thought of perfluorocarbon particles getting into food. Cookware which is based on impregnation of the release coating into a hard, porous surface are somewhat more abrasion resistant than PTFE over smooth aluminum, but will still release perfluorocarbon particles into food if metal implements are used while cooking in them.

Another problem with perfluorocarbon-coated cookware is that, if it is overheated, the polymer layer will be damaged, and can release toxic fumes. (This should not happen in ordinary cooking, but it does mean that the cookware can be accidentally ruined quite readily.)

Another problem with perfluorocarbon-coated foodware (including especially, but not exclusively cookware) is that extremely hydrophobic foodware surfaces composed of fluoropolymers are also not wetted easily by cooking oil, so cooking oil "beads up" in the bottom of the foodware, which is not desirable. The perfect non-stick foodware surface in terms of surface chemistry would be wetted by olive oil very well, but be as hydrophobic as possible towards water-based dispersions and/or solutions containing starch, protein, and/ or sugar.

There are a variety of other high-temperature stable polymers used in cookware besides the perfluorocarbon polymers. Examples include silicone resins and polyimides, for example. These types of polymers are mainly limited to ovenware, because their thermo-oxidative stability is not good enough to stand up to the much higher temperatures used in stovetop cooking. As with the perfluorocarbons, these ovenware coatings are easily scratched by metal culinary tools.

All the polymers described above can in principle be used for foodware items besides cookware, though they are more prone to be damaged than similar foodware made of stainless steel, for example.

Many types of ceramic coatings and/or foodware surfaces are known in the prior art. Most are based on oxides or mixed oxides (aluminates, aluminosilicates, and silicates are mixed oxides) that are melted or fired (which involves partial melting). Oxide and mixed oxide surfaces are relatively hydrophilic in the sense that water droplets residing on a clean oxide surface will wet the surface. (Wetting the surface means that the contact angle between the liquid/ vapor interface and the liquid/solid interface at the leading edge of a droplet sitting on a solid surface is less than 90 degrees; good wetting implies that the contact angle is less than 10 degrees. See FIG. 1 for an illustration of contact angle.)

Foods sticking to foodware is mainly a problem for cookware. Other types of foodware, though, such as serving bowls and trays of the prior art can also be very hard to clean after various foods dry out on them (which should never happen in a well-managed kitchen, yet it does happen in reality). We shall use the term "solidify" in regard to foods cooking, dehydrating, or fermenting in such a way that an initially fluid food is converted to a solid. Adhesion of solidified foods to a foodware surface is dependent on:

1. the actual surface area of the foodware per unit of apparent surface area (which depends on microscopic surface roughness).
2. the fraction of foodware surface area which is wetted by the food (which depends on how much of the interfacial area between the food and foodware is occupied by gas bubbles; poor wetting of the foodware by the food increases bubble coverage of the interface, reducing interfacial adhesion). When foodware is coated by a highly hydrophobic coating, such as PTFE, the high contact angle of semisolid foods tends to cause more gas bubbles to be trapped at the food/foodware interface, reducing adhesion proportionately.

3. the interfacial adhesion between the solidified food and the foodware. This adhesion operates over the true interfacial area between food and foodware, after compensating for roughness and gas bubbles. Interfacial adhesion is a result of intermolecular forces, which are strongest between highly polar groups, such as hydroxyl and amide groups in particular. Most foods contain numerous hydroxyl groups and proteins contain numerous amides, and so foods tend to stick more tenaciously to foodware surfaces containing hydroxyl groups.

4. The strength of the solidified food. If the solidified food is very weak, it will be easy to clean regardless how strong the molecular-level adhesion of the solidified food to the surface.

In comparing different surfaces with equivalent surface roughness, hydrophobic surfaces tend to have better food release properties (less adhesion between the food and the foodware) than hydrophilic surfaces. The only commercially significant prior art examples of highly hydrophobic surfaces on foodware are PTFE and other fluoropolymers, and silicone resins (used in bakeware, primarily).

The improved, coated foodware of this invention can be coated by PVD ("physical vapor deposition"), or CVD ("chemical vapor deposition"). PVD implies that the metallic portion of the coating composition goes into the coating chamber as a condensed phase, usually a solid or molten metal or metallic alloy, but in some few cases as a solid or liquid compound (such as an oxide, nitride, or carbide) containing metal atoms. In CVD, the metal atoms enter the coating chamber as a gas. The reactive species which react with the metal (if any) generally enter the coating chamber as a gas for both PVD and CVD processes.

Plasma plays a role in some CVD and PVD processes, to varying extents. Evaporation of metals (a PVD process) and atmospheric CVD do not involve plasma at all. CVD processes at reduced pressure also usually do not involve plasma, except for plasma-assisted CVD. Plasma is critical to both the sputtering process and cathodic arc deposition, the two most important PVD processes. Plasma-assisted CVD occurs at much lower temperatures than gas phase CVD; diamond films can be deposited via plasma assisted CVD at temperatures as low as 300° C.

PVD can occur by several different processes. In all of these processes, it is desirable to coat the workpiece with atoms, molecules, and atomic/molecular ions (collectively, "atomic-scale species"), rather than microscopic molecular clusters or macroscopic droplets. All the PVD methods have the potential to deposit clusters or droplets as well as atomic-scale species. For all PVD coatings, the potential for clusters and droplets forming goes up with increasing pressure and decreasing mean free path of gas/plasma phase reactive species. Reactive PVD involves introducing a reactive gas into the chamber, which can lead to the formation of nitride or oxide coatings for example (using nitrogen & oxygen reactive gases). PVD includes the following specific methods (these methods are listed in order of increasing energy of the arriving atoms, molecules, or ions impinging on the surface to be coated):

1. Evaporation is the lowest energy gas/plasma deposited PVD coating process. Atoms or molecules arrive at the surface with approximately the thermal energy they have when they evaporate, less than 2 electron volts. Few charged species are usually formed or deposited in evaporated coatings. Evaporation works best for depositing layers of pure metal, for which the chamber pressure is determined by the vapor pressure of the metal, and can be as high as $10^{-3}$ torr. Evaporation can be from a liquid metal crucible, or via evaporation of a wire feed with an electron beam. It is very difficult, perhaps impossible to achieve efficient deposition of a metal nitride by reactive evaporation. In reactive evaporation, a gas which reacts with the metal vapor is allowed into the chamber, at a partial pressure comparable to that of the metal vapor. A complication of reactive evaporation is that as the pressure in the chamber increases, molecular clusters form in the gas phase, which does not lead to the desired low porosity, dense film on the foodware or other workpiece to be coated. Therefore, reactive evaporation is usually applied at reactive gas partial pressures no higher than $10^{-5}$ torr. It is possible to efficiently deposit a mixed metal/metal nitride film via reactive evaporation (this is an example of a partially nitrided PVD coating). Adhesion is often problematic with evaporated coatings; they are far less resistant to contamination on the workpiece surface than alternative PVD processes in which the arriving deposited atomic-scale species bring more energy to the surface per unit of material deposited.

2. Sputtering is driven by a plasma of non-reactive atoms. Argon is usually used, but helium, neon, and xenon could all be used. To deposit nitrides or oxides (for example), a reactive gas is also introduced (nitrogen or oxygen), but the partial pressure of the reactive gas is normally less than the partial pressure of argon and/or other non-reactive gases. (This process, reactive sputtering, can deposit extremely smooth layers of various nitrides and oxides.) The plasma is excited by a radio frequency oscillating magnetic field. The argon plasma evaporates a metal target, and the evaporated metal (atoms, molecules, and ions) streams away from the target. Magnetic fields can be applied at the target to trap ions, which speeds up evaporation of the metal target by trapping plasma ions near the target surface; this is known as magnetron sputtering. Some of the sputtered metal deposits on the workpiece, and a lot usually winds up on the chamber walls, because it can't be aimed. Most of the sputtered material is not charged when it reaches the workpiece surface, but a larger fraction of arriving atomic-scale species are charged than is the case in evaporation; typically 20% are ionized. Applying a voltage to the workpiece, or modifying the radio frequency or intensity driving the plasma can change the fraction of the deposited material arriving at the surface as ions. An important fact about sputtering is that the argon plasma (both argon atoms & ions) delivers far more energy to the workpiece surface than the incoming metal/metal nitride atoms, ions, and molecules. This constant bombardment, of the surface tends to minimize residual stresses and defects in the surface. One can think of sputtering as analogous on a molecular level to shot peaning, in which repeated impacts on a metal surface lead to increased toughness. All this unproductive (in terms of laying down a coating) expenditure of energy also means that sputtering is relatively energy inefficient compared to evaporation. It is also common to use energetic argon plasmas to bombard and clean the workpiece surface. Oxide layers can for example be removed by an argon plasma treatment. A very desirable feature of sputtering is that it can be used to deposit a very wide variety ceramics. For example, non-electrically conductive carbides, nitrides, and oxides can be used as targets in sputtering, so that a much wider range of ceramic coatings can be applied by sputtering compared to other PVD methods. It is vital to have pressure low enough so that most of the deposited material travels from the target to the workpiece without encountering another atom or molecule on the way. Such an atomic-scale specie is said to be "ballistic" in that it has most of the energy it was given by the sputtering process when it impacts the workpiece surface. Ballistic atomic species in sputtering typically have kinetic energy around 15–20 electron volts, about ten times as much as atomic scale species impacts in evaporated PVD coatings. The desirability of ballistic trajectories for sputtered atomic scale species implies that the mean free path of atoms in the chamber must be further than the separation distance between the target and workpiece, so it is important to keep this separation small (typically about 15 cm). For a typical sputtering application, this implies that the pressures during sputtering are around $10^{-6}$ torr at most, and more typically at $\sim 10^{-8}$ torr. The low pressures limit the rate of deposition; sputtering is therefore one of the slowest PVD process.

3. Cathodic arc deposition is a PVD process in which metal is first ionized (by an electric discharge most commonly, but also sometimes by lasers, electron beams, or ion beams) and the positively charged ions are electrically attracted to the workpiece. A major complication is that small droplets, which may be charged, are also formed in the ablation of the target; these droplets are a major cause of coating defects. In reactive cathodic arc deposition there is a reactive gas (typically nitrogen or oxygen) present. Depending on the vacuum level, the ions attracted to the workpiece might be ballistic, or they may have numerous collisions in their trajectory from the target to the workpiece. The bias voltage between the workpiece and the metal ion plasma can vary widely; it is customary to start out with relatively high voltages, high vacuum, and no reactive gas present so as to imbed the incoming metal ions into the surface ballistically. Ballistic metal ions can also be used to clean a mildly contaminated surface by ablation. Ballistic metal ions cause localized mixing, leading to a "fuzzy" boundary between the primer metal (titanium or chromium typically) and the substrate workpiece, which inhibits interfacial failure. One particular type of cathodic arc deposition is the ion plating method described in U.S. Pat. No. 5,447,803. In ion plating, an initial primer layer of metal is applied to the workpiece using a bias voltage between 300–1500 volts typically, in a vacuum below $10^{-6}$ torr (typically $10^{-7}$ torr). The partial pressure of nitrogen in the coating chamber is then raised high enough that a metal ion is likely to encounter several nitrogen molecules in its trajectory from the target to the workpiece (typically $10^{-5}$ torr). After each such collision, even if there are chemical reactions, the metal-containing fragment generally remains positively charged and so continues on its trajectory towards the workpiece (because of the bias voltage). Ion plating works best when a particularly appropriate molecular ion is formed efficiently from the collisions of metal ions with a reactive gas. This is especially the case for titanium (which tends to form the $TiN^+$ ion), and for zirconium (which tends to form the $ZrN^+$ ion), with nitrogen as the reactive gas. Titanium and zirconium are particularly appropriate for ion plating because these elements readily form compounds with the metal in both the +3 oxidation state (such as TiN, ZrN), and the +4 oxidation state (such as $TiO_2$, $Ti_3N_4$, $ZrO_2$, $TiN^+$, and $ZrN^+$). Magnetic fields can be used to steer the cathodic ion stream somewhat.

4. Ion beams can be used as part of a PVD process, for example to ionize a target for cathodic arc, or in some cases may be applied directly to a workpiece. One particular example of an ion beam coating process is filtered cathodic arc, a technique known in the art. In this process, crude molecular ion plasma is "filtered" by being bent by magnetic fields. Only ions with the correct charge/mass ratio and velocity are bent by the selected angle. This technique allows for the separation of clusters and droplets from a stream of ions. The nearly pure stream of molecular ions produced by filtered cathodic arc (e.g., $TiN^+$ and/or $ZrN^+$) can properly be called an ion beam. Most ion beams, though, are based on either noble gases (e.g., argon) or reactive gases (e.g., oxygen or nitrogen). Such ion beams can be used in conjunction with a reactive carbon-containing gas to deposit diamond-like carbon (DLC). Oxygen or nitrogen ion beams can also be used to efficiently oxidize or nitride a metal film laid down by other. means. Another relevant example of a coating which can be applied directly by an ion beam is the coating formed by application of charged buckminsterfullerene ($C_{60}$) to a workpiece.

These processes are known in the art. The evenness of the coating deposition in any of these processes is enhanced via repositioning or preferably rotating the foodware during the coating process. Surface polishing operations between two or more plasma coating treatments improves corrosion resistance, because it decreases the chances of a pinhole penetrating both coating layers.

Chemical vapor deposition (CVD) is also a well-developed process with many different variations. In general, gas phase CVD usually occurs at higher temperatures and higher pressures than PVD. Indeed, some CVD processes occur at atmospheric pressure. The most relevant CVD processes from the viewpoint of the present invention occur at reduced pressure, and are accelerated by a plasma (so they also occur at reduced temperature compared to gas-phase CVID processes); such processes are known as "plasma-assisted CVD".

Plasma-assisted CVD is a process that looks a lot like reactive sputtering in terms of equipment used, and methods of operation. However, there is no sputtering target, and the reactants (other than the substrate) enter the coating chamber as gases. The most important CVD process in terms of the present invention is the plasma-assisted CVD of diamond films. In this process, atomic hydrogen plays a critical role in allowing diamond to form (even though graphite is favored thermodynamically). Because diamond has such superior properties, there has been a very large amount of research interest in developing diamond films, and the field is by now well advanced. It is possible to grow CVD diamond on a variety of substrates, though freshly polished carbides and nitrides work particularly well.

Extremely smooth oxides, as may be deposited by PVD in particular, can have excellent non-stick properties even though they have hydrophilic surfaces that are easily wetted by sticky food solutions and/or suspensions of starches, sugars, and proteins. A prime example of this is contained in U.S. Pat. No. 5,447,803, which describes a process for stabilizing titanium nitride coatings on cookware via post-treatments in either hot nitrogen gas, or a nitrogen/oxygen mixture (with less $O_2$ than air).

Insofar as U.S. Pat. No. 5,447,803 is the closest prior art to the present invention, we shall discuss it in detail below. U.S. Pat. No. 5,447,803 mentions PVD (physical vapor deposition) and CVD methods for applying the coatings, but with only one type of PVD process discussed in any detail, ion plating (a cathodic arc deposition process).

U.S. Pat. No. 5,447,803

The cookware of U.S. Pat. No. 5,447,803 were first coated with a primer layer of titanium metal ~0. 02 micron, followed by reportedly up to 3 microns of titanium nitride ($TiN_x$). This is actually pushing the practical limits for $TiN_x$ coatings, which are normally put down no thicker than 2 microns because they become prone to flaking off when put on the surface too thickly. This initial $TiN_x$. coating was primarily composed of TiN, but reportedly contained metallic titanium as well (i.e., x<1.0). Although U.S. Pat. No. 5,447,803 discloses titanium nitride-coated cookware, the claims that were allowed apply only to post-oxidized $TiN_x$ cookware. Claims 1 and 2 of U.S. Pat. No. 5,447,803 are limited to post-treated pans that were exposed to an atmosphere in which the ratio of oxygen to nitrogen was between 1:20 to 1: 5. Claims 3 and 4 are dependent on claims 1 and 2, and so are also limited to the same range of $O_2:N_2$ ratio.

The patent text of U.S. Pat. No. 5,447,803 clearly describes three modes for TiN-coated pans. (The description makes it clear that the invention is only applicable to shallow pans.)

1. Mode 1 of U.S. Pat. No. 5,447,803 is application of TiN (PVD or CVD coating) over a titanium metal primer layer. Mode 1 is not described by any Claim of U.S. Pat. No. 5,447,803.

2. Mode 2 of U.S. Pat. No. 5,447,803 involves the surface chemical modification of Mode 1 coatings by post-treatment at atmospheric pressure and a temperature at or above 350 degrees C., in a gas mixture containing oxygen and nitrogen as the major components. Claim 1 limits the mole ratio of $O_2:N_2$ to be between 1:20 to 1:5, yet the text of the patent leaves open the possibility of treatment via Mode 2 of TiN-coated pans in air (in which the $O_2:N_2$ ratio is 1:4).

3. Mode 3 of U.S. Pat. No. 5,447,803 involves the surface chemical modification of Mode 1 coatings by post-treatment at a temperature at or above 350 degrees C., by an atmosphere consisting of essentially pure nitrogen.

Although U.S. Pat. No. 5,447,803 clearly describes all three modes summarized above, the claims of U.S. Pat. No. 5,447,803 do not read on Mode 1 or Mode 3 of U.S. Pat. No. 5,447,803. Therefore the technology described as Mode 1 and Mode 3 of U.S. Pat. No. 5,447,803 have been disclosed but not patented, and so are no longer patentable per se.

Based on the reported gold color and stoichiometry of the cookware of U.S. Pat. No. 5,447,803, it could not have contained a large amount of $Ti_3N_4$ ($Ti_3N_4$ is brown). Two different stabilizing methods are described in U.S. Pat. No. 5,447,803: controlled oxidation (Mode 2) and further nitriding (Mode 3).

In controlled oxidation (Mode 2 of U.S. Pat. No. 5,447, 803), a surface layer is oxidized to titanium dioxide ($TiO_2$), at a preferred temperature between 350–500° C. The surface layer of $TiO_2$ that forms is reportedly only about 0.02 microns thick, Since $TiO_2$ occupies more volume than TiN or Ti, there is an expansion when the $TiN_x$-coated surface is oxidized. This expansion puts the outermost surface of the coating into compressive stress, which tends to close surface microcracks and inhibit new cracks from forming. Because the protective $TiO_2$ layer is so thin, it can be easily breached by sharp cooking or serving implements, or scratched through in normal service. This would defeat the color stabilization process of Mode 2 of U.S. Pat. No. 5,447,803, as the $TiN_x$ layer under any such scratches would tend to change color during cooking, leading to a pan displaying at least two different gold color tones.

When a TiN-coated pan is stabilized via Mode 3 of U.S. Pat. No. 5,447,803, it is heated in a nitrogen atmosphere at temperatures between 350° to 600°C. This converts some Ti metal to TiN (as proposed in the text of U.S. Pat. No. 5,447,803), but this is not the only process expected to occur under the reaction conditions described. When $TiN_x$ is heated to 350° to 600°C. in nitrogen, further nitriding of the surface will occur, producing a $Ti_3N_4$, surface. Efficient conversion to $Ti_3N_4$ was not recognized to have occurred by the authors of U.S. Pat. No. 5,447,803, though they did describe a deepening of the gold color tone, which is consistent with formation of a thin layer of $Ti_3N_4$, of approximately 0.02 microns thickness (similar to the thickness of the $TiO_2$ layers formed in Mode 2).

FIG. 12 of U.S. Pat. No. 5,447,803 also shows evidence that a new crystal form of $TiN_x$, has appeared on the surface of Pan C (based on x-ray diffraction experiments). This was not noted by the authors of U.S. Pat. No. 5,447,803. As with Mode 2 stabilization (oxidation), there is an expansion when the $TiN_x$-coated surface is further nitrided to $Ti_3N_4$. This expansion puts the outermost surface of the coating into compressive stress, which tends to close surface microcracks and inhibit new cracks from forming. As with Mode 2 stabilization, the protective $Ti_3N_4$ layer is thin, and it can be easily breached by sharp cooking or serving implements, or scratched through in normal service.

$TiN_x$-coated cookware prepared by all three Modes of U.S. Pat. No. 5,447,803 performed well in experiments involving deliberate burning of foods in the pans. The color of the Mode 1 pan changed during cooking, developing discoloration that looked different in different places on the pan. No difference was noted in adhesion of burned foods between Mode 1 ($TiN_x$) versus Mode 2 ($TiO_2$), or Mode 3 ($Ti_3N_4$) surfaces. Application of the Mode 2 oxidized surface did not change the appearance of the original substrate (Mode 1) pan, but did stabilize its appearance. A darkening of the gold color of the Mode 3 ($Ti_3N_4$) coated pans versus the Mode 1 and Mode 2 pans was noted. The nitrided surfaces of Mode 3 pans appear darker due to the thin layer of $Ti_3N_4$ that forms at the surface.

Both types of color-stabilized pans (Mode 2 and Mode 3) maintained their color after repeated cooking experiments. (These cooking experiments did not include deliberate efforts to test the scratch resistance of the pans). Note though, that even the $Ti_3N_4$ coated pans will have a thin $TiO_2$ layer after a relatively short exposure time to oxygen at cooking temperatures, which would tend to equalize the sticking behavior between all three types of pans (as was actually reported).

SUMMARY OF THE INVENTION

Definitions and clarification of terms used in this patent:

Cookware means: pans for stovetop cooking, bakeware, grills, griddles, spatulas, ladles, and other cooking utensils, and food preparation machinery that is used to cook food.

Foodware includes cookware, food preparation devices including cutlery and other manual food processing devices (examples: garlic press, grater), food serving devices (examples: plates, platters, bowls), and utensils for eating food.

Terminology such as $TiN_x$, $ZrN_x$ refers to non-stoichiometric compounds formed usually in reactive PVD processes. In this disclosure, this nomenclature is used only for metals like titanium and zirconium that have several different valence states, and so are particularly prone to forming non-stoichiometric films. (Compounds like SiC, BN, or AlN usually form nearly stoichiometric films.)

"nitride alloys of (Al, Ti, Cr, and Zr)" means mixed ceramics composed of AlN, $TiN_x$, $CrN_x$, $ZrN_x$, for example.

"conductivity/density" has the units (watt/meter·kelvin)/(kilograms/liter); it is used as a figure of merit with units $(W·cm^2/100·g·K)$ for comparing different materials for cookware. Table 1 gives data on this parameter for several different materials discussed in this invention.

The contact angle of a liquid with a solid substrate is the angle between the liquid/vapor interface at the point where it touches the solid surface (the "triple point") and the solid/liquid interface at the triple point, measured through the liquid rather than through the vapor. (See FIG. 1.)

The improved foodware of this invention incorporates at least one the following novel features:

1. Improved scratch resistance can be attained via a layer of chromium or aluminum nitride, which is applied to a depth from 2–50 microns in particular areas of the foodware prone to scratching . These scratch resistant coatings can also serve as primer layers for other topcoat ceramic layers.

2. Improved foodware of this invention incorporates gold-colored ceramic-coated foodware with improved color stability in which the color stability is enhanced by either:

using oxygen or nitrogen plasma to stabilize the color after a PVD coating process, or zirconium nitride and/or zirconium-titanium nitride alloys are applied as the top visible ceramic layer on the foodware, determining its color and its resistance to discoloration.

an optimized PVD process is used in which $TiN_x$ or $TiN_x$-based alloys are deposited via cathodic arc deposition at a temperature between 375–450° C.; or Such gold-colored ceramics can also be overcoated with hydrophobic ceramics, or clear ceramic layers to enhance surface gloss.

3. Ceramic-coated foodware with improved non-stick properties in which a hydrophobic ceramic such as diamond; diamond-like carbon; carbon-based alloys with boron, nitrogen, silicon, or titanium; boron nitride; zirconium carbide; or silicon carbide is applied as a smooth coating in a PVD or CVD process.

4. Ceramic-coated foodware with improved heat transfer in which the surface touching food being cooked or chilled is composed of a high thermal conductivity ceramic, such as diamond, diamond-like carbon, silicon carbide, or aluminum nitride.

5. Ceramic foodware with improved non-stick properties and improved thermal fatigue resistance in which a fired ceramic such as aluminum nitride or silicon carbide is used to form an item of foodware, such as a grille or a pan. The polished surface of such foodware is a very good cooking surface per se, or this surface can be further modified by PVD or CVD processes.

6. Ceramic coated foodware in which a top clear layer of silicon nitride, alumina, or diamond-like carbon is applied for decorative effect, creating a "lacquered" surface appearance.

7. Ceramic-coated metal foodware in which adhesion and corrosion resistance is enhanced via a first primer layer of chromium, and a second primer layer of chromium nitride, followed by a third layer of a nitride or carbide ceramic of the prior art.

8. Ceramic-coated foodware (or a component of foodware, such as a pan but not the handle) in which a substrate foodware item composed of an aluminum alloy is plasma sprayed with chromium or a high chromium alloy. Said outer plasma-sprayed chromium layer may optionally be polished, electroplated with additional chromium, or PVD coated with additional chromium prior to application of a chromium nitride $(CrN_x)$ layer. After the $CrN_x$ layer is applied, the various PVD and CVD coatings of this invention may then (optionally) be applied over the $CrN_x$ primer layer.

9. The improved foodware of this invention includes designs in which an anisotropic thermal core containing graphite is contained inside a metallic shell, similar to the cookware of U.S. Pat. No. 4,541,411, but improved by interlayering the graphite sheets with a soft, conductive metal. By combining graphite with other materials it is possible to achieve a selected thermal anisotropy between that of aluminum and that of pure graphite. Such improved foodware may optionally be coated by PVD or CVD ceramic coatings of this invention or the prior art.

10. The improved foodware of this invention includes ceramic-coated designs in which the substrate foodware below the ceramic outer surface is composed of a carbon-carbon composite.

11. The improved foodware of this invention includes ceramic-coated designs in which alternating layers of chromium/chromium nitride are interlayered to enhance the surface toughness of the foodware .

The surface finish of the ceramic-coated foodware of this invention is desirably locally smooth such that no asperity deviates more than 10 microns from the local average surface level. American National Standard ANSl B46. 1 (1985) presents a standard method to measure surface roughness and waviness in terms of the root mean square (rms) deviations from a local average plane. This is also discussed in detail in *Machinery's Handbook,* $24^{th}$ Edition (Industrial Press, Copyright 1992). In general, the ceramic-surfaced foodware of this invention should desirably have an rms surface roughness below 10 microns. Preferably, the surface finish of the ceramic-coated foodware of this invention should be such that the rms surface roughness is less than 2 microns. More preferably, the surface finish of the ceramic-coated foodware of this invention should be such that the rms surface roughness is less than 0.2 microns, and the smoother the better. Such surfaces are "specular", in that one can see a reflection in the surface. A very high polish has been found to be the best cooking surface texture. Such a surface can be readily distinguished by observing a reflected image from the surface. A very smooth surface will reflect a crisp image in which image boundaries are not fuzzy (though they may be distorted).

Foodware with wavy and textured surfaces (for example, surfaces that contain grooves, or surfaces which have been deposited by plasma spraying) may also be coated with one of the hard ceramic coatings of this invention, and would still be an example of the present invention, though such surfaces are less desirable than a smooth surface.

This invention includes improved, coated foodware in which the outer ceramic coating sits on a strong, corrosion resistant, primer layer based on chromium nitride, aluminum nitride, and/or their alloys. Both chromium nitride and aluminum nitride are relatively tough and ductile compared to most vacuum-deposited ceramic coatings (including specifically diamond, titanium nitride, zirconium nitride, and alloys of titanium and zirconium nitride). As a result, it is feasible to place layers of chromium or aluminum nitride as thick as 50 microns onto metal substrates, provided that thermal expansion mismatch to the substrate is not too bad. (In comparison, titanium nitride, zirconium nitride, and alloys of titanium and zirconium nitride are usually limited to no more than 2 microns thick.)

Aluminum nitride has successfully been used as an experimental engine block for adiabatic diesels; it was chosen for this application mainly for its toughness and excellent properties at high temperature. Chromium nitride is used in commercial cylinder liners for diesel engines, as well as metal working tools. Chromium nitride ($CrN_x$) has better oxidation resistance than aluminum nitride (AlN), whereas aluminum nitride has higher thermal conductivity. Both AlN and $CrN_x$ can serve as primers for CVD diamond and PVD $TiN_x$, $ZrN_x$, and their alloys.

Thick coatings of $CrN_x$ and AlN (~3–30 microns) are significantly tougher against gouging, than the ~2 micron titanium nitride coatings of U.S. Pat. No. 5,447,803. Alloys of these tough ceramics with minor amounts $TiN_x$ or $ZrN_x$ are also known to be much tougher than $TiN_x$, $ZrN_x$, or $ZrN_x/TiN_x$ alloy coatings. This is an area of high R&D interest among companies that apply PVD coatings, and there are numerous different alloys being applied commercially at this time. These ($CrN_x$ or AlN)-based coatings can either extend to the outer surface of the foodware, or a decorative or functional topcoat comprised of one or more layers of PVD- or CVD-deposited ceramics can be used over the ($CrN_x$ or AlN)-based coatings, while still retaining the enhanced resistance against scratching and gouging due to the ($CrN_x$ or AlN)-based layer.

A wide variety of alloys comprised primarily of the four nitrides $TiN_x$, $ZrN_x$, $CrN_x$ and AlN are useful as coatings on foodware. A wide variety of colors can be attained from such alloys. Note though, that as the coating formulation gets more complex, it becomes more difficult to maintain color uniformity. This consideration argues against complex alloys of nitrides at the exterior of any item of foodware in which it is important to maintain color uniformity. Such complex alloys are anticipated to be useful in applications where color uniformity between many different pieces is not critical, such as commercial cookware. Eventually, as the technology matures, it will be possible to routinely maintain constant color with complex alloys of these nitrides.

U.S. Pat. No. 5,447,803 did not specify the temperatures at which PVD or CVD coatings were applied to produce the TiN-coated pans of Mode 1 of U.S. Pat. No. 5,447,803. It is certain that the Mode 1 pans of U.S. Pat. No. 5,447,803 were not coated by an optimized PVD process, based on the degree of color instability they exhibited. Also note that all the pans of U.S. Pat. No. 5,447,803 were first primed by titanium metal before being coated with TiN, which makes the coatings more reactive towards electrolytic corrosion than if the primer metal is chromium. One particular improvement over the methods used to apply TiN coatings in U.S. Pat. No. 5,447,803 is to apply TiN over a previously coated item of foodware, in which a first layer of chromium metal is followed by a second layer of $CrN_x$, followed by the topcoat $TiN_x$-based coating.

This type of bilayer primer improves stability of the coating, even if the $Cr/CrN_x$ layers are very thin. This type of bilayer primer can also improve toughness of the coating, if the $CrN_x$ layer is thicker than 2 microns.

Improved foodware of this invention incorporates gold-colored ceramic-coated foodware with improved color stability. One method to achieve this stabilization is to use plasma oxidation or plasma nitriding to create protective outer layers similar to those of U.S. Pat. No. 5,447,803, but as part of the PVD process. Another highly preferred method to achieve color stability is to use zirconium nitride, or an alloy of zirconium nitride for the outermost visible surface of the ceramic-coated foodware. The color stability of a titanium nitride film is increased by optimizing the details of how it is deposited. An optimal method for depositing $TiN_x$ involves cathodic arc deposition around 400° C.

U.S. Pat. No. 5,447,803 describes two post-treatment methods by which PVD $TiN_x$-coated pans were color stabilized, Mode 2 involves a post-oxidation, and Mode 3 involves a post-nitriding treatment; both treatments occurred in an oven at atmospheric pressure. Modification of a thin surface layer of a deposited ceramic, as in modes 2 and 3 of U.S. Pat. No. 5,447,803 results in a thin surface layer (~0.02 micron) of either $TiO_2$ or $Ti_3N_4$. These surface layers protect the substrate $TiN_x$ from oxidation (oxidation or reduction of an optically thick $TiN_x$ coating can cause the color to change).

Essentially similar oxidized outer layers to those produced by mode 2 of U.S. Pat. 5,447,803 can be developed much more quickly in the same PVD or plasma assisted CVD chamber used to apply the $TiN_x$-coating, via oxygen plasma treatment. It has been found that foodware surfaces composed primarily of TiN can be oxidized very efficiently by an oxygen plasma at the end of a PVD deposition process. This produces a surface much like that produced by Mode 2 of U.S. Pat. No. 5,447,803, in only a few minutes. This process also works for nitride alloys of (Al, Ti, Cr, and Zr).

Essentially similar nitrided outer layers to those produced by mode 3 of U.S. Pat. 5,447,803 can be developed much more quickly in the same PVD or plasma assisted CVD chamber used to apply the $TiN_x$-coating, via nitrogen plasma treatment. It has been found that foodware surfaces composed primarily of TiN can be oxidized very efficiently by a nitrogen plasma at the end of a PVD deposition process. This produces a surface much like that produced by Mode 2 of U.S. Pat. No. 5,447,803, in only a few minutes. This process also works for nitride alloys of (Al, Ti, Cr, and Zr).

Modification of a thin surface layer of a deposited $TiN_x$-based ceramic, as in modes 2 and 3 of U.S. Pat. No. 5,447,803, or via plasma oxidation or plasma nitriding of $TiN_x$-based alloys, as described in the previous paragraphs results in a thin surface layer (~0.02 micron) of either $TiO_2$ or $Ti_3N_4$ (for example). These surface layers protect the substrate $TiN_x$ from oxidation (and therefore stabilize the color, especially where x<1). Such $TiO_2$ or $Ti_3N_4$ surface layers are resistant to cracks that cross the surface plane of the foodware because they are under compression, as described in the background section on U.S. Pat. No. 5,447,803. However, there is a definite limit to how thick such a surface film under compression can be, because if a layer under compression gets too thick, it will flake off. Because this surface protective layer is so thin, it can be damaged (small areas flake off) without making a visible dent or scratch in the surface. (Damage could be caused by sharp stainless steel food handling equipment; knife points are the most severe example.) Even a small flaked off area of this film would change the color stability of the $TiN_x$ film below, and would eventually become visible as a mottled surface appearance as the substrate oxidizes. Under real use conditions in a kitchen, localized damage to a 0.02 micron protective film on foodware is probable if not assured, and if such a protective film is compromised by flaking off or crack formation through the protective surface films of $TiO_2$ or $Ti_3N_4$, it will discolor. Therefore it is particularly desirable to produce a gold-colored foodware item that remains color stable even if the outer 0.02 micron or so of the coating is removed or breaks down in some way.

A preferred method to achieve a stable gold color is to use zirconium nitride and/or zirconium-titanium nitride alloys as the top visible layer on the foodware, determining its color and its resistance to discoloration.

$ZrN_x$ is a light gold color similar to champagne. It is often alloyed with $TiN_x$ to modify its color (and vice versa). Alloys containing 30% or more of zirconium nitride exhibit improved color stability compared to TiN alone, which is believed to be due to the rapid oxidation of $ZrN_x$ to $ZrO_2$. This leads to expansion of the surface layer of the coating, putting the outermost surface under a static compressive load. This tends to prevent microcracks, leading to a tough surface layer which is an excellent barrier against further penetration by oxygen.

$ZrN_x$ oxidizes much more readily than $TiN_x$, and the formation of the $ZrO_2$ layer protects the substrate nitride in much the same way as Mode 2 of U.S. Pat. No. 5,447,803, in which a TiO2 layer is formed to stabilize the color of a prior art ceramic-coated pan. Unlike the difficult oxidation of $TiN_x$ described in U.S. Pat. No. 5,447,803, $ZrN_x$ oxidizes rapidly at room temperature, so the protective zirconia film is re-formed quickly if it is scratched off. This leads to improved color stability. The process of zirconium nitride oxidation on the surface of a ceramic-coated item of foodware is an example self-passivation of a foodware surface.

It has been found that PVD coatings of $TiN_x$ applied at a temperature of approximately 400° C. (between 375–450° C.) are more color stable, exhibit better adhesion, and are more abrasion resistant than coatings applied at lower temperatures. This also applies to ceramic alloys of $TiN_x$ with minor additions (less than 30% by weight) of carbon or (zirconium, chromium, or aluminum) nitrides. The color stability of a $TiN_x$-based film is also improved if the film is rich in nitrogen, i.e., if x>1. This implies that at least a portion of the titanium in the film is in the +4 oxidation state ($Ti_3N_4$). x>1 also implies there should be no titanium metal in the coating (because of defects, such as "spits" this may not be the case in a real PVD process).

It has also been found that chromium followed by chromium nitride is preferred as a primer for $TiN_x$, particularly when the coating is applied to ferrous metals. When chromium is used as a primer, a chromium layer on the order of 0.02 micron (typically) is followed by a (usually thicker) $CrN_x$ layer, which is an excellent substrate for deposition of nitride alloys of (Al, Ti, Cr, and Zr), CVD diamond, and many other ceramics of this invention. The $Cr/CrN_x$ combination is an excellent primer layer for many different ceramics, partially because of its low thermal expansivity and relatively high ductility and toughness (compared to most ceramics). Both chromium and CrN are well-matched in thermal expansivity to nitride alloys of (Al, Ti, Cr, and Zr). Chromium forms a superior PVD-applied primer layer over stainless steel compared to titanium, the other common primer layer for titanium nitride. A titanium-stainless steel interface is potentially subject to electrochemical corrosion because of the differing electron affinities of the titanium and stainless steel. The electron affinities of chromium-stainless steel are more nearly matched compared to titanium-stainless steel, which minimizes the speed and driving force for electrolytic corrosion of a chromium-stainless steel interface.

The improved, coated foodware of this invention can be based on substrate foodware composed of carbon steel that is electroplated with chromium. This is advantageous especially for cookware because both carbon steel and chromium are better thermal conductors than stainless steel. The chromium electroplated surface is intrinsically smooth (electroplating tends to fill in surface pits and crevices), and can also take a high polish, which is a very desirable feature for foodware that is to be plasma coated with a ceramic layer that reproduces the finish of the substrate. Unfortunately, the adhesion between steel and chromium applied by electroplating is often poor; hydrogen embrittlement of the interface often contributes to reduced adhesion.

Other types of substrate foodware besides carbon steel can also logically be electroplated with chromium. Stainless steel for example can be electroplated with chromium to improve the smoothness and reflectivity of the surface. (This is particularly relevant if clear ceramic layers are applied to the foodware, so that the highly reflective chromium surface is visible through the layers above it. Clear topcoat layers will be discussed later.) In most cases, chromium is not electroplated directly onto a ferrous metal surface. Nickel primer layers are often used to improve the adhesion of the chromium.

This invention also applies to ceramic-coated foodware based on a plasma-sprayed aluminum alloy substrate, wherein the outermost layer of the plasma spray coating consists of chromium or a high-chromium alloy. Such a chromium plasma spray method, applied to an aluminum foodware substrate, followed by deposition of one or more ceramic coatings of this invention, is believed to be novel and is a particularly economical way to prepare a superior item of foodware, especially stovetop cookware. Such a chromium plasma-sprayed foodware object may optionally be electroplated with additional chromium prior to application of the various PVD and CVD coatings of this invention. Because electroplating has a strong tendency to be deposited in crevices in the surface being coated (especially at low applied voltage), electroplating of a plasma-sprayed surface tends to smooth out rough edges and fill in crevices. Electroplating of a substrate workpiece that already has a chromium surface will be far more resistant to interfacial adhesive failure, since there is no bimetallic junction between the electroplated coating and the substrate. The resultant plasma sprayed and electroplated aluminum-core cookware is ideal for PVD deposition of Cr/CrN, and from that base, virtually any other PVD or CVD ceramic coating can be applied (as long as the application temperature is below the melting point of the aluminum substrate foodware item).

Look Manufacturing Company currently produces stainless steel-coated aluminum pans by plasma spraying aluminum cookware with stainless steel. If the same process were done using chromium rather than stainless steel, the resultant substrate cookware would have a higher thermal conductivity surface (chromium is a much more thermally conductive metal than any grade of stainless steel). The resultant surface from plasma spray is very tough, but is also uneven and not good for release of foods during cooking (especially in the case of a metal oxide surface). However, since one plasma-sprayed surface of this invention consists of pure chromium, which is the very best substrate for chromium electroplating or PVD chromium deposition, it is possible to smooth out some of the surface roughness via chrome plating, as described above.

Chromium is a difficult metal to shape. It does not draw into metal forming dies readily, so large objects of chromium are often machined after casting, forging or fabrication by welding. Compared to the labor-intensive methods typically used to fabricate chromium, plasma spray, electroplating, and PVD chromium deposition are particularly convenient methods to create chromium shapes.

Ceramic-coated foodware with improved non-stick properties can be prepared by coating the foodware with a hydrophobic ceramic such as diamond; diamond-like carbon (DLC); carbon-based alloys with boron, nitrogen, silicon, or titanium; boron nitride; zirconium carbide; or silicon carbide; in a CVD or PVD process. One can think of DLC as a carbon-hydrogen alloy. DLC carbon is less thermally stable against oxidation than diamond, whereas crystalline silicon carbide is even more oxidation-resistant than diamond. These relatively hydrophobic ceramics have contact angles of water with the surface which are larger than the maximum contact angles of pure water on oxide ceramics ($TiO_2$, $Al_2O_3$, $Cr_2O_3$ or $ZrO_2$). At the same time, the contact angles of pure water on the hydrophobic ceramic surfaces of this invention are less than the contact angle of water on a PTFE surface.

This invention applies to ceramic-coated foodware with improved heat transfer in which the surface touching food being cooked or chilled is composed of a high thermal conductivity ceramic, with thermal conductivity better than low-carbon steel [(greater than 80 Watt/(meter*Kelvin)]. Examples of such high thermal conductivity ceramics include diamond, diamond-like carbon, boron nitride, silicon carbide, or aluminum nitride. Many of these particular ceramics are also desirable for other reasons, as set forth herein. For example, both chromium nitride and aluminum nitride can be applied rather thickly compared to many other more brittle ceramics, to produce a tough, scratch-resistant surface, but only AlN has high enough thermal conductivity to also qualify under some situations. Diamond is the ultimate cooking surface, and can be used for the purpose of food release, high conductivity, and/or as a decorative surface film.

The surface toughness of ceramic-coated foodware of this invention can be enhanced via a multilayer structure incorporating alternating layers of metal/ceramic, especially by interlayering relatively ductile ceramics like $CrN_x$ between layers of tough and strong chromium. When metal/ceramic layers are interlayered in this way, it is particularly important to match the thermal expansivity of the metal and the ceramic. Chromium is a particularly desirable metal to use in this way because of its low thermal expansivity compared to most metals. This sort of multilayer composite is commonly used in metal working tools to prolong tool life.

Ceramic foodware with improved non-stick properties and improved thermal fatigue resistance can be prepared from a fired ceramic such as aluminum nitride or silicon carbide. Such an item of foodware will be rather brittle, and so is more applicable as a grille than as a pan, for example. The surface of such foodware can be polished to yield a very good cooking surface. Alternatively, this surface can be further modified by PVD or CVD processes. Sintered ceramics are very good substrates for PVD or CVD coatings insofar as it is possible to get a closer match of thermal expansivity and elastic modulus between two ceramics than between a ceramic coating and a metal substrate.

Silicon carbide is particularly desirable as a foodware surface, because of its combination of properties: excellent food release and scratch resistance, good toughness, and excellent high temperature stability. Silicon carbide "furniture" is common in kilns, to support greenware during firing of ceramics, and in this application the SiC kiln furniture is used repeatedly in air at temperatures around 1200° C. Unfortunately, SiC is difficult to deposit as a film coating on a metal substrate by either PVD or CVD. Therefore, in one embodiment, this invention pertains especially to SiC, which though difficult to sputter or apply by cathodic arc, can be readily sintered, and indeed there is a sizable industrial trade in polished sintered SiC parts for, among other things, rotary seals. (SiC can be deposited by CVD, but generally these methods occur at temperatures too high to be applicable to cookware containing aluminum alloys.)

This invention also applies to ceramic-coated foodware in which a top clear layer of silicon nitride, alumina, diamond, or diamond-like carbon is applied for decorative effect, creating a "lacquered" surface appearance. In order to produce the desired effect on surface appearance, such a clear coating will have to be at least as thick as a half-wavelength of blue light (at least 0.2y microns, where y is the index of refraction of the clear ceramic coating), since otherwise it will not interact strongly with visible light.

The improved foodware of this invention can incorporate a variety of high-thermal conductivity inner or bottom layers ("thermal cores") which are different than the food contact surfaces of the foodware. (Heat transfer is mainly but not exclusively relevant to cookware; bowls used for chilling and ice cream makers also in principle can benefit from thermal cores, for example.) The thermal core of a foodware item can be composed of many different materials known in the prior art, such as aluminum copper, or the graphite cores of U.S. Pat. No. 4,541,411.

Carbon is unique among potential thermal core materials in that a wide range of both thermal and mechanical properties can be obtained from various forms of carbon. Diamonds and graphite exhibit the highest thermal conductivities of any known solids. For diamond, the high conductivity (about five times higher than silver) is isotropic. In diamonds, all the carbon atoms are $sp^3$-hybridized, whereas in graphite, the carbon is $sp^2$-hybridized. The symmetry of $sp^2$-hybridized carbon means that the molecules themselves grow as crystalline sheets. Graphite crystals consist of planar sheets, and are highly anisotropic. At room temperature, thermal conductivity in the crystal plane of graphite is very similar to diamond, and about 200 times as high as the thermal conductivity of graphite perpendicular to the sheets.

A novel type of thermal core is divulged herein, in which alternating layers of metal and graphite foil are used to form the core of an improved item of foodware. In this case, multiple sheets of flexible graphite foil are interlayered with a soft, high conductivity metal such as copper or silver (either electroplated onto the graphite foil or as a separate foil) or aluminum foil, to form a superior thermal core.

Such an anisotropic thermal core layer can spread the heat around the cookware much more evenly than an isotropic or nearly thermally isotropic layer (such as aluminum). The thermal anisotropy of pure graphite crystals is actually too large to be optimal for use as a thermal core for foodware. By combining graphite with other materials it is possible to achieve a selected thermal anisotropy between that of aluminum and that of pure graphite.

In a cookware item of this invention, stainless steel inner and outer shells extend further out radially than the graphite foil/metal foil stack (the thermal core). The shells are shaped to form a pocket for the thermal core, and are positioned above and below the stack of alternating foils of the thermal core. The multilayered structure is pressed under high pressure and preferably at elevated temperature into a metal-forming die to reduce the voids between the soft metal and the graphite sheets, and to form the final shape of the multilayer item of foodware with improved even distribution of temperature over the food contact surfaces thereof. The thermal core by design does not extend to the edges of the inner and outer shells. Subsequent to forming the sandwich comprised of inner shell, thermal core, outer shell, the edges of the inner and outer pan are joined by any suitable means to form a novel item of foodware, with improved heat spreading properties. This type of foodware is useful even without the ceramic coatings of this invention, though it is also a particularly useful type of foodware for application of the ceramic coatings of this invention.

A particularly convenient form of graphite for use in foodware is the flexible sheet form ("graphite foil" generically), which is used for gaskets and rotary seal packing material. This material (described by U.S. Pat. No. 3,404,061) is available for example from UCAR Carbon Company, Inc. of Cleveland, Ohio as Grafoil® flexible graphite. This material, when compressed to a density of 1.44 g/cm$^3$, has thermal conductivity nearly equivalent to copper (375 watt/m·K) in the plane of the sheet. The thermal conductivity through the sheet is only 75 watt/m·K, which is lower by a factor of 3.67 compared to the in-plane conductivity. Such a compressed layer of Grafoil® flexible graphite is more than twice as good as aluminum (evaluated in terms of equivalent mass) for spreading heat around a pan evenly.

effect can also be obtained by the novel method of filling the voids between the graphite flakes with a high thermal conductivity metal. Copper- and aluminum-impregnated Grafoil® is a preferred embodiment of this invention. Composites of Grafoil® with metals can be formed by isostatic pressing of alternating layers of Grafoil® with metal foils. Such composites can serve either as a foodware thermal core or as the main body of advanced foodware. Copper or silver can also be electroplated onto Grafoil®. The resultant composite from electroplating Grafoil® with copper or silver can be compressed to a strong, high conductivity sheet, with or without additional foil layers between the electroplated Grafoil® sheets.

Another form of carbon, known as a carbon/carbon composite, is also thermally anisotropic, and unlike graphite foil, is also very strong. Such carbon/carbon composites are strong enough to serve as the substrate foodware to which the ceramic coatings of this invention are applied. Although these materials are at present very expensive, they may in the future be practical for foodware, and are the subject of this invention. Since carbon-carbon composites are themselves often built up by a CVD process applied to a carbon-fiber containing substrate, such carbon-carbon composite substrate foodware items are particularly well suited for application of CVD coatings such as CVD diamond and/or CVD SiC.

TABLE 1

Heat Conduction Properties of Foodware Materials
Room temperature heat conduction per unit mass

| units: | Density (g/cm^3) | thermal conductivity in plane (watt/m · K) | thermal conductivity perpendicular (watt/m · K) | (in-plane value) conductivity/density "figure of merit" (W · cm$^2$/100 · g · K) | Thermal Anisotropy |
|---|---|---|---|---|---|
| Carbon Allotrope | | | | | |
| polycrystalline diamond | 3.51 | 2300 | 2300 | 655.3 | 1 |
| graphite | 2.25 | 2000 | 10.0 | 888.9 | 200 |
| carbon/carbon composite | 1.55 | 275 | 75.0 | 177.4 | 3.7 |
| amorphous carbon | 1.95 | 1.6 | 1.6 | 0.8 | 1 |
| Grafoil ® graphite felt[1] | | | | | |
| uncompressed | 1.12 | 140 | 5.0 | 124.9 | 28 |
| moderate compression | 1.28 | 275 | 50.0 | 214.6 | 5.5 |
| intermediate compression | 1.44 | 375 | 75.0 | 260.1 | 5 |
| high compression | 1.47 | 400 | 85 | 271.4 | 4.7 |
| (for comparison) | | | | | |
| aluminum | 2.702 | 273 | 273 | 101.0 | 1.0 |
| copper | 8.96 | 398 | 398 | 44.4 | 1.0 |
| chromium | 7.2 | 91 | 91 | 12.64 | 1.0 |
| iron | 7.86 | 80 | 80 | 10.22 | 1.0 |
| nickel | 8.9 | 90 | 90 | 10.10 | 1.0 |
| silver | 10.5 | 427 | 427 | 40.67 | 1.0 |
| titanium | 4.5 | 20 | 20 | 4.4 | 1.0 |
| zinc | 7.14 | 115 | 115 | 16.11 | 1.0 |
| AISI 304 stainless steel | 7.93 | 16.3 | 16.3 | 2.06 | 1.0 |
| AISI 316 stainless steel | 7.96 | 16.3 | 16.3 | 2.05 | 1.0 |
| aluminum alloy 1100-0 | 2.71 | 225 | 225 | 83.18 | 1.0 |
| aluminum alloy A357-T6 | 2.71 | 153 | 153 | 56.54 | 1.0 |

[1]Grafoil ® is supplied by UCAR Carbon Company of Cleveland, OH.

The thermal properties of Grafoil® flexible graphite change quite a lot as it is compressed, as shown by the data in Table 3. The thermal conductivity of Grafoil® flexible graphite increases with compression because of better contact between the graphite flakes when compressed. A similar The improved, ceramic-surfaced foodware of this invention have the following improved properties compared to the substrate foodware prior to modification, or non-stick foodware of the prior art. (Note that not all these improvements are found in each embodiment of the present invention.)

more resistant to abrasive scrubbing than other decorative, shiny foodware (such as copper, brass, or stainless steel);

more resistant to scratching and gouging than prior art metallic or $TiN_x$-coated cookware of U.S. Pat. No. 5,447,803;

better for release (non-stick) properties during cooking than prior art stainless steel, copper, aluminum, anodized aluminum, or ceramic-coated foodware, including the surface modified $TiN_x$-coated cookware of Modes 2 or 3 of U.S. Pat. No. 5,447,803;

better for retention of a highly polished decorative surface finish during cooking than prior art metallic foodware (such as copper, brass, or stainless steel) or the $TiN_x$-coated cookware of U.S. Pat. No. 5,447,803;

simpler surface stabilization (via ambient oxidation) of $ZrN_x$ surfaces compared to the $TiN_x$ surfaces of the cookware of U.S. Pat. No. 5,447,803;

more resistant to leaching of ions into food from the foodware by food acids than prior art metallic foodware;

more resistant to soaking, detergent washing and caustic automatic dishwasher cleaning solutions than aluminum, anodized aluminum, or oil-treated steel or cast iron foodware;

more resistant to salt-catalyzed corrosion than stainless steel foodware;

better spreading of cooking oil or other edible fats over the cooking surface of the foodware than perfluorocarbon-coated foodware.

Corrosion Resistance of Coated Foodware

A potential quality issue for some types of improved foodware of this invention (particularly those foodware designs in which a ceramic coating is applied to a metal substrate) is the resistance to corrosion of the coated foodware by salt and/or food acids. When corrosion of the improved foodware of this invention does occur, it is believed to proceed primarily via pinholes in the coating. Pinholes allow corrosive chemicals access to a surface where corrosion can occur. Several different means are known to improve the corrosion resistance of PVD or CVD-coated metal objects:

1. Highly corrosion resistant substrate foodware may be employed, which have outer surfaces that are more corrosion resistant than AISI 304 stainless steel, such as AISI 316 stainless steel, silicoaluminates, borosilicate or quartz glass, the glass-matrix composites of U.S. Pat. No. 4,265,968, stellite or other cobalt alloys, chromium or chromium alloys, monel, or titanium.

2. Relatively thick primer layers of highly corrosion resistant metals or alloys may be employed to minimize the chance that pits can penetrate through both the primer and the coating.

3. Multiple alternating layers of primer metal/ceramic/primer metal/ceramic, etc. may be employed; in most cases pinholes will not penetrate through several alternating layers. Provided that the primer metal/ceramic interface is not subject to corrosion in the presence of salty water, food acids, and/or oxygen, such foodware can be extremely corrosion resistant.

4. Gradual interfacial layers may be generated via high-energy ion bombardment (as per U.S. Pat. Nos. 4,764,394 or 5,354,381 for example). Gradual interfacial layers are characterized by an interfacial zone rather than a sharp interfacial line between base metal and primer metal, and also between primer metal and ceramic coating; these gradual interfaces are usually free of pinholes and have excellent corrosion resistance. These gradual interfaces improve adhesion of plasma-applied ceramics greatly, and make it possible to get excellent adhesion without a metallic primer layer.

5. Re-fixturing the foodware in the coating chamber between individual coating treatments tends to decrease the likelihood that individual pinholes penetrate through the entire coating layer; this may be applied either to the alternating layers of (3) above, or to repeated layers of one single ceramic or metal.

6. Re-polishing the foodware between subsequent coating operations practically guarantees that pinholes will not line up. This method can, but need not, involve re-fixturing the foodware between coating, polishing, and re-coating. It is preferable from a cost viewpoint if the polishing can be performed in the coating chamber.

PREFERRED EMBODIMENTS OF THE INVENTION

The improved, coated foodware of this invention specifically includes foodware in which the surface layer of the substrate foodware under the ceramic coating is composed of an austentitic stainless steel, such as AISI 304 or 316 alloy. Unfortunately, these stainless steels have low values of conductivity/density (2.05–2.07 at room temperature).

The improved, coated foodware of this invention can also be based on substrate foodware in which the surface layer of the substrate foodware under the ceramic coating is composed of titanium. The coating/substrate bond is enhanced when $TiN_x$ is applied over titanium. Unfortunately, titanium, like stainless steel, is a relatively poor thermal conductor (but better than stainless steel). Titanium is also difficult to polish.

The improved, coated foodware of this invention can also be based on substrate foodware with a chromium surface. Compared to steel, stainless steel, aluminum, titanium, or copper, chromium is better matched in thermal expansivity to the ceramic coatings of this invention. Chromium also has the highest strength and hardness of any of these metals, which is also a desirable feature of a foodware surface to be coated with one of the hard ceramics of this invention. Also, compared to the tough metals stainless steel, carbon steel, titanium, and nickel (for example), chromium has a higher conductivity/density of 12.6 (see Table 1).

Therefore, from the standpoint of quality, chromium is the best surface for metal foodware items which are to be coated by the ceramics of this invention. However, from the standpoint of cost, conventional aluminum core stainless steel cookware is particularly desirable, and also readily available; consequently the foodware experiments described herein below are all based on foodware or test coupons of stainless steel.

A highly preferred embodiment of the invention is ceramic-coated foodware based on a plasma-sprayed aluminum alloy substrate, wherein the outermost layer of the plasma spray consists of chromium or a high-chromium alloy. Such a chromium plasma spray method, applied to an aluminum foodware substrate, followed by deposition of one or more ceramic coatings of this invention, is believed to be novel and is a particularly economical way to prepare a superior item of foodware, especially stovetop cookware. Such a chromium plasma-sprayed foodware object may optionally be electroplated with additional chromium prior to application of the various PVD and CVD coatings of this invention.

Another particularly desirable type improved foodware of this invention includes metallic foodware designs in which an anisotropic thermal core of graphite is contained inside a metallic shell, as disclosed in U.S. Pat. No. 4,541,411. A stovetop cookware pan as disclosed in U.S. Pat. No. 4,541,411 can be coated with one of the ceramics of this invention, for example. More desirably, an improved thermal core layer composed of alternating sheets of soft metal and graphite can be used as the thermal core of an item of foodware, to spread the heat around the foodware much more evenly than an isotropic or nearly thermally isotropic layer (such as aluminum). By combining graphite with other materials it is possible to achieve a selected ratio of thermal conductivity in the plane of the thermal core to the conductivity through the core. Also, by using graphite sheets that have been electroplated with copper or silver, it is possible to press the multilayer thermal core graphite composite into a shape that is retained after the pressure is released. Such a multilayer shaped composite is easier to incorporate into a multicomponent foodware item, compared to simply trapping a compressed graphite layer between the tough metal inner and outer foodware shells (as was disclosed in U.S. Pat. No. 4,541,411).

A particularly preferred group of embodiments of the invention from a technical point of view are the carbon/carbon composites, coated with CVD diamond or SiC. These materials are strong enough to serve as the substrate foodware to which the ceramic coatings of this invention are applied. Indeed carbon/carbon composites are the strongest class of materials discussed in this disclosure. Carbon/carbon composites also possess very desirable heat transfer properties and low weight. Although these materials are at present very expensive, they are finding many new applications, so their cost has been falling. They may in the future become practical for foodware, and are therefore the subject of this invention. Since carbon-carbon composites are themselves often built up by a CVD process applied to a carbon-fiber containing substrate, such carbon-carbon composite substrate foodware items are particularly well suited for application of CVD coatings such as CVD diamond and/or CVD SiC. Indeed, they represent one of the few types of cookware that could stand the conditions typically used to build up SiC by CVD (1600° C. or higher).

The improved foodware of this invention also includes specifically foodware with an outer diamond or diamond-like carbon (DLC) layer over a carbon-carbon composite, or a metallic carbide, nitride, or carbonitride. Various carbides and nitrides, including specifically both the nitrides and carbides of boron, silicon, chromium, titanium and zirconium, serve as excellent primer layers for plasma-CVD diamond. Diamond has excellent non-stick properties, contributes to abrasion resistance, and has very high thermal conductivity. Also, because plasma-CVD diamond can be built up at temperatures as low as 300° C., and at high rates at 450° C., it is practical to apply plasma-CVD diamond to conventional stainless steel-clad aluminum substrate cookware. (The aluminum-stainless steel bond of such cookware is destroyed if the temperature goes above 560° C.)

A particularly preferred ceramic coating layer structure involving diamond as the top layer is comprised of chromium metal deposited directly on the substrate, followed by chromium nitride, followed by plasma-assisted CVD diamond.

Another particularly preferred ceramic coating layer structure involving diamond as the top layer is comprised of chromium metal deposited directly on the substrate, followed by chromium nitride, followed by PVD titanium nitride, followed by plasma-assisted CVD diamond.

Another particularly preferred ceramic coating layer structure involving diamond as the top layer is comprised of chromium metal deposited directly on the substrate, followed by chromium nitride, followed by PVD zirconium nitride, followed by plasma-assisted CVD diamond.

Another particularly preferred ceramic coating layer structure involving diamond as the top layer is comprised of chromium metal deposited directly on the substrate, followed by chromium nitride, followed by PVD zirconium/titanium nitride alloy, followed by plasma-assisted CVD diamond.

Another particularly preferred ceramic coating layer structure involving diamond as the top layer is comprised of chromium metal deposited directly on the substrate, followed by chromium nitride, followed by PVD titanium carbonitride, followed by plasma-assisted CVD diamond.

EXAMPLE STOVETOP COOKWARE PANS 1–3

Three 10-inch omelet pans were obtained in early 1990 from West Bend Industries, Premier Cookware Division. These pans were manufactured in 1989, by a process that has since become outmoded in the construction of premium quality foodware. These pans were constructed of relatively thick inner and outer elements of stainless steel (~1.0 millimeter), with a much thicker piece of aluminum (~6 millimeter), sandwiched between them. This type of pan does not have a strong metallurgical bond between the aluminum core disc and the surrounding stainless steel pan shell. The aluminum thermal core continued only a short way up the sides of the pan, between the inner and outer stainless steel shells in the outer wall of the omelet pan. (The aluminum layer did not extend all the way to the rim of the pan.) It is believed that some slippage occurs in such pans between the core and shell as the temperature changes, which minimizes thermomechanical stresses due to differential thermal expansion of the core and shell.

All three of these pans survived the ion plating PVD coating process without warping or (obvious) delamination. The PVD ion plating, was performed by a contract PVD coater without knowledge of the pan temperature during the coating process. The shape of the aluminum core disc, the high strength of the stainless steel shell, the diffuse nature of the ion bombardment in ion plating, and the weak bonding between the core and shell of these pans probably contributed to the survival of these pans in the PVD process without warping.

Example Pans 1–3 had stainless steel handles that were attached to the pan via stainless steel threaded studs, which were in turn welded to the pan. The handles were first bolted to the studs, then the nut and stud end were welded together to prevent loosening of the handle in service. These pans also had two extra studs in addition to the one used to mount the handle; the three studs were arranged at 120-degree angles from each other around the pan. The two extra studs were added so that the pans could be grounded at several points. This is important because the plasma (an ionic electric current) tends to take the shortest path to ground, so grounding the piece being coated at only one point can result in an inhomogeneous distribution of the coating.

Example Pans 1–3 were only intentionally coated on their front surfaces. The coating layers in the cooking area of these pans consisted of about 2 microns of titanium nitride over about 0.02 micron of titanium primer. These pans are believed to be similar to the Mode 1 pans of U.S. Pat. No. 5,447,803. The backs of these pans were coated by a thin "overspray" of ions that missed the pan, and swung around to hit it from the backside. The pans were held by a rotating electrode, which gripped the three studs, and rotated the pan during application of both the primer titanium coating, and the titanium nitride topcoat.

These three pans were quite beautiful, and the coating appeared uniform. Even though the TiN layer on the outside of the pan was quite thin, it did not look different except in a few exceptionally thin areas. The PVD-applied TiN layer replicated the surface finish of the substrate pan very well. No change in surface roughness was noted due to the coating process. No delamination due to thermal stress from differential expansion of aluminum versus stainless steel was noted.

Example Pans 1–3 were together an experiment to determine the optimum surface finish for stovetop foodware. The surface finish of Example Pan 1 was not modified before it was coated (this pan had a "mill finish"). Example Pan 2 was polished to a specular finish on the cooking surface prior to application of the coatings. This pan was by far the most attractive of the three pans, and was the best of the three pans for not sticking to food during cooking. Example Pan 3 was bead blasted with glass beads prior to application of the coatings. Example pan 3 had a matte finish and was the worst of the three pans in terms of food sticking during cooking trials.

Example Pan 2 was by far the best of Example Pans 1–3, both in terms of cooking properties and appearance. This indicates that a highly polished surface finish is best for cooking properties. This agrees with the conclusions of U.S. Pat. No. 5,447,803.

All three pans were unharmed by stainless steel cooking implements. A stainless steel spoon, even when rubbed dry against the surface with more force than is normally used in cooking, left no visible mark on Example Pan 2 (the polished pan). When a stainless steel spoon was rubbed against Example pan 3, a silvery mark was left on the pan comprised of abraded stainless steel particles; these particles could readily be washed off, however. Example Pan 1 (mill finish) was intermediate in abrasiveness towards the metal spoon between Example Pans 2 and 3; a visible mark was left by a stainless steel spoon only if the spoon was rubbed across the grain of the mill finish.

Water Droplet Salt Test

Example Pan 1 (the "mill finish" pan) was later tested for susceptibility to salt corrosion, in the following way. (This same method was also applied to test salt corrosion of Example Pan 4 and Control Pan 4.) Each individual test involves placing a 0.15 milliliter drop of water on the horizontal surface of a pan, followed by a pile of salt, about 5–6 grams, which is large enough to completely cover the water droplet. This is placed on a gas burner and heated rapidly to drive off the water. After the pan cools, the coated surface under the pile of salt is examined. Approximately one third of the water droplet salt tests performed on Example Pan 1 resulted in visible delamination of the coating off the substrate pan. The failure is believed to have occurred at the titanium/stainless steel interface.

EXAMPLE PANS 4 and 5

Example Pans 4 and 5 were based on two substrate pans from West Bend Industries, Premier Foodware Division, which were manufactured in 1996 by a different process than was used for Example Pans 1–3. These pans each have stainless steel shells, both inner and outer shells. The aluminum core in these pans extends throughout the body of the pan, all the way to the lip of the pan where it is visible. Example Pan 4 was a square griddle, 10×10 inches, with rounded corners. Example Pan 5 was a 10-inch omelet pan.

These pans were manufactured by drawing a metallurgically bonded 3-layer clad sheet. The innermost layer was composed of aluminum alloy, which was clad with stainless steel. During the production of the clad metal sheets used in the manufacture of this cookware, the metal surfaces are abraded just before being sandwiched together to form the clad metal sheet, and then rolled out to a reduced thickness in the production of the clad sheet. The freshly ground surfaces form a strong metallurgical bond (between aluminum and stainless steel), stronger than other known methods, except explosive forming. Sheets of the laminated metal sheet are purchased by a foodware manufacturer such as West Bend Industries, Inc. for conversion to cookware. The pans were made by first die cutting appropriate blanks, then drawing the pans in a metal-forming die at ambient or slightly elevated temperature to form the foodware. The handle was applied later, by resistance welding. (Note that welding is not desirable as a means of joining clad metal pans of stainless steel over aluminum, since the welding temperature destroys the adhesion of the aluminum to the stainless steel immediately beneath the weld.) This method of forming the multilayer foodware results in large residual mechanical stresses between the various layers of the foodware.

The Example Pans 4 and 5 were coated as follows. These pans were first cleaned with an argon plasma, using a 1400 volt discharge to remove organic compounds and oxides from the surface. The next step was application of a chromium primer layer. Both the primer layer and the titanium nitride topcoat were applied by High Intensity DC cathodic arc deposition, hereafter termed HID-PVD. Example Pans 4 and 5 were not rotated during application of the plasma, and the energy deposition rate per unit surface area of the item being coated is much higher in HID-PVD than in the ion plating process used for the first three Example Pans. The high plasma energy deposition rate normally causes large thermal gradients and temperatures well above the coating chamber temperature to occur locally during the HID-PVD coating process.

In the HID-PVD process, a DC arc is struck between a chromium or titanium electrode and a similar chromium or titanium target. The voltage and current used to maintain this arc can be varied widely, from 1 to 20 kilowatts. As the power increases, the target gets hotter and emits more spits (molten metal droplets). The target can also be water-cooled to reduce the emission of spits. This plasma arc energy converts part of the target to a plasma, and also any shielding gas that contacts the metal ion plasma. The metal electrode is barely or not at all eroded by the coating process, since it is emitting electrons, which does not erode the surface. The target is both heated and vaporized as the energetic electrons strike its surface, generating the metal ion plasma; this is the "primary arc." The whole DC arc circuit described above (electrode, target, and power supply) is energized by a voltage applied between this circuit and the coated object (workpiece), typically 100–200 volts, to attract positive ions away from the target and towards the workpiece; the coulombic flow of cations to the workpiece is the "coating current." The workpiece must be a good electrical conductor to complete the circuit. The ampere-seconds passed through the coating current are directly related to mass of material deposited by the plasma on the workpiece (not a simple linear relationship because of spits and because there may be several different cations present).

During deposition of nitrides, nitrogen is introduced into the vacuum chamber and reacts with the ionized metal plasma. Positively charged ions and droplets from the primary arc are accelerated by the bias voltage toward the foodware. Magnetic fields are applied to steer the plasma; it is possible to even rotate the plasma discharge using changing magnetic fields. This method of steering the plasma allows the surface of the foodware to be coated rather evenly, or unevenly in a deliberate way, for example to obtain defined thickness coatings on specific parts of the foodware.

The fraction of the total plasma current carried by individual ions versus condensed, charged droplets can be varied by adjusting the machine parameters. In particular, a small primary arc and a water-cooled target minimize droplets in the plasma and produce the smoothest possible coating. Operating HID-PVD this way is relatively inefficient in terms of the amount of mass deposited per unit time in the coating chamber. In some cases it is desirable to allow metal droplets to be deposited onto the target, so as to improve the energy efficiency of the process. In this case it is desirable to let the target in the primary arc system get very hot, and to decrease the temperature of the plasma by reducing the gap between the electrode and target.

In the primer coating process, chromium electrodes and a chromium target were used. The target was water cooled, and the chamber was maintained in a high vacuum condition (pressure around $10^{-7}$ torr). No gas was introduced into the chamber during application of the chromium primer layer. After a substantial chromium primer layer had been applied (~1 micron), nitrogen gas is introduced so that the pressure in the chamber increases to about $10^{-5}$ torr. The coating chamber was maintained at 250° C. throughout the chromium and chromium nitride coating processes. The pans were also at 250° C. initially, but were strongly heated locally by the plasma. Example Pan 4 failed by delamination of the stainless steel inner pan surface from the aluminum core during application of the chromium nitride primer. This delamination was caused by a combination of differential thermal expansion of stainless steel versus aluminum and the high thermal gradients produced by the localized plasma spray impinging on the foodware. The inner stainless steel layer pulled away from the aluminum core in this pan, though only on one side of the pan (a square griddle with rounded corners). Because aluminum expands more for a given temperature increase than stainless steel, the increasing temperature lead to increasing tensile stress in the stainless steel as the aluminum substrate pan expanded. This expansion stressed the stainless steel of both the inner and outer shell, but only the inner stainless steel layer is more prone to failure because of the vector forces at the corner, which pulls the inner shell away from the aluminum core. Example Pan 5, which is a circular omelet pan, survived the application of the chromium primer with no discernable damage.

Although Example Pan 4 experienced a delamination in the substrate pan itself in the primer coating process, the final coating process was finished, though care was taken during the final stage coating to put Example Pan 4 in a position within the coating chamber such that it did not receive the brunt of the plasma. Example Pan 4 was placed near the periphery of the coating chamber during application of the TiN topcoat, and was coated by "overspray" rather than the high-density plasma that occurs in the center of the plasma plume. Example Pan 4 experienced no further delamination during application of the TiN plasma.

The $TiN_x$ coating chamber, titanium electrodes and a titanium target were used in a separate step from the chromium/chromium nitride application described above. The target was water cooled, and the chamber was pumped down to a moderately high vacuum condition (~$10^{-7}$ torr). Nitrogen gas was then introduced into the chamber and maintained during the process, so that the vacuum level was reduced to ~$10^{-5}$ torr. The coating chamber was maintained at 400° C. throughout the $TiN_x$-coating process. The pans were also at 400° C. initially. Example Pan 5, which was directly sprayed by the plasma plume, was strongly heated locally by the plasma, delaminated in a similar way to the delamination experienced by Example Pan 4 in the chromium primer application process. As with Example Pan 4, the delamination of Example Pan 5 occurred only between the inner foodware stainless steel surface layer (the inner shell) and the aluminum core.

Salt Corrosion Testing of Example Pan 4 and Control Pan 4

Example Pan 4 and Control Pan 4 are square stainless steel griddles with detachable phenolic handles, which screw into "female" mounting lugs welded to the main stainless steel outer layer of the griddle. Example Pan 4 was grounded only through this lug during plasma processing. These griddles have an inner core layer of aluminum, sandwiched between two stainless steel shells. These pans are identical except that Example Pan 4 was coated as described above, and Control Pan 4 was not. Thirteen 0.15 ml water droplets were placed on the surface of both Example Pan 4 and Control Pan 4, and each droplet was covered with salt, then the pans were rapidly heated, as described above. Neither pan showed any sign of damage from the salt corrosion test. This experiment provided no meaningful insight as to whether HID-PVD produced less porous surface films than the PVD process used to coat the first three Example Pans, since the control pan was also highly resistant to chloride corrosion.

Example Pan 4 and Control Pan 4 were further subjected to corrosion by thirteen 0.15 ml drops of concentrated aqueous hydrochloric acid (HCl). Control Pan 4 was pitted by the HCl everywhere it was applied, whereas Example Pan 4 was not damaged by the acid at all. This is evidence that Example Pan 4 had a very low incidence of pinholes and/or cracks. In this regard, the HID-PVD cathodic arc deposition at 400° C. produced a superior film to the ion plating process.

EXAMPLE PANS 6 and 7

Examples 6 and 7 were made by All-Clad Metalcrafters, LLC of Canonsburg, Pa., in 1997. These pans were coated by HID-PVD by the methods described above. These samples were 7 inch omelet pans, but without a handle. These pans were also based on clad metal composites. Examples 6 and 7 both survived the chromium/chromium nitride coating process without delamination.

Example 6 was then placed in a $TiN_x$ coating chamber, as described above, at 400° C. The pan was grounded through a sharp pin at the bottom side center of the pan. The HID-PVD plasma plume was directed on the pan's inner cooking surface, and the inner stainless steel layer of Pan 6 delaminated; this inner surface delamination was very similar to that seen in Example Pan 5; the entire bottom of the pan detached from the aluminum core, but the stainless steel inner shell remained attached at the sides to the aluminum core. In this case, the entire outside stainless steel shell of the pan popped off the aluminum core. The adhesion in this case failed between both stainless steel shells (inner & outer) of the pan and the aluminum core; the inner stainless steel layer (at the food contacting surface) remained attached to the aluminum core along the inner wall of the pan, but only after some of the stress was relieved by the delamination of the center part of the inner stainless steel shell off the aluminum core.

Example Pan 7 was then coated with $TiN_x$ successfully, with no delamination, by placing this pan at the periphery of the HID-PVD chamber. This pan (and others coated by HID-PVD at 400° C.) had a noticeably darker gold color than any of the other Example Pans coated by the other PVD processes of the examples. This implies that "x" in $TiN_x>1$.

This illustrates the importance of being able to apply a coating at a temperature below about 500° C. In this regard, the recent technological advances in low temperature plasma-assisted CVD diamond have created the first practical opportunity to put diamond coatings on clad metal pans of stainless steel/aluminum.

EXAMPLE TEST PIECES 8–15

Eight small samples were obtained that were either coated with ceramics of this invention, or in the case of the silicon carbide sample, was wholly composed of a ceramic of this invention. These samples had a variety of different ceramics of this invention at their surface, as follows:

| Material | color | Patent Example # | Relative Food sticking* | Flame Color Stability | Oven color stability |
|---|---|---|---|---|---|
| TiN | gold | 8 | 5 | poor | good |
| TiCN | red-gold | 9 | 4 | poor | good |
| ZrN | champagne | 10 | 4 | poor | good |
| "BB" | black | 11 | 5 | poor | good |
| AlTiN | slate gray | 12 | 4 | poor | good |
| CrN | dull silvery | 13 | 3 | poor | good |
| diamond | clear | 14 | 2 | good | good |
| SiC | gloss gray | 15 | 2 | good | good |

*compared to stainless steel with equivalent polish = 10; PTFE = 1; lower numbers stick less Examples 8–13 are stainless steel coupons.

Example 14 is a small test coupon

Example 15 is a polished silicon carbide rotary seal.

SUMMARY OF FIGURES

FIG. 1 illustrates the phenomenon of wetting of a substrate by a liquid. The contact angle α if measured from the tangent to the liquid/vapor interface to the solid/liquid interface, through the liquid phase.

Figure two illustrates two typical types of foodware in which heat transfer occurs in order to change the physical form of food: a pan for stovetop cooking and an ice cream maker. In both these cases a ceramic coating applied to the food contact surfaces is useful for decreasing corrosion (and the resultant ionic pollution of food), reducing friction, enhancing appearance, and easing clean up. FIG. 2 illustrates one particular embodiment of the invention in which a relatively tough layer is adhered to the thermal core of a clad metal foodware item. The thermal core can comprise aluminum, graphite, graphite/metal composite, carbon/carbon composite, or a fired ceramic, for example. Said tough layer can be composed of stainless steel, chromium, or titanium for example if the substrate is metallic. If the substrate is sintered SiC, this tough layer might be a CVD SiC topcoat (which is less porous & tougher than sintered SiC). and their alloys. Above said tough layer, the foodware of FIG. 2 is coated with two additional ceramic layers. The first of these layers is a gold-colored $ZrN_x/TiN_x$ layer, followed by a plasma-assisted CVD diamond layer thick enough to give the surface a lacquered appearance and a hydrophobic surface.

Figure 1:
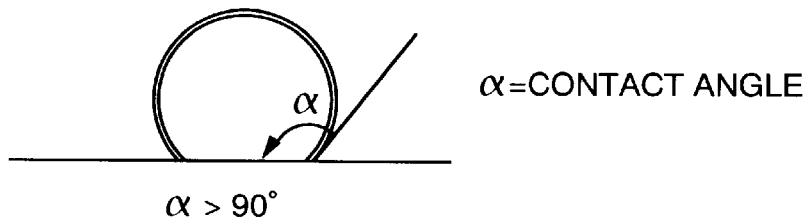
FIG. 1
Figure 1:
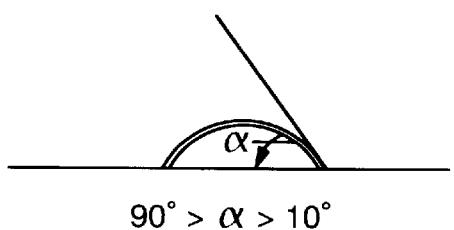
Figure 1:
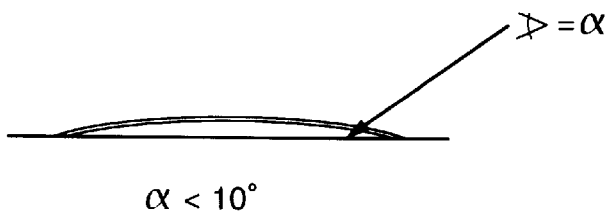
Figure 2:
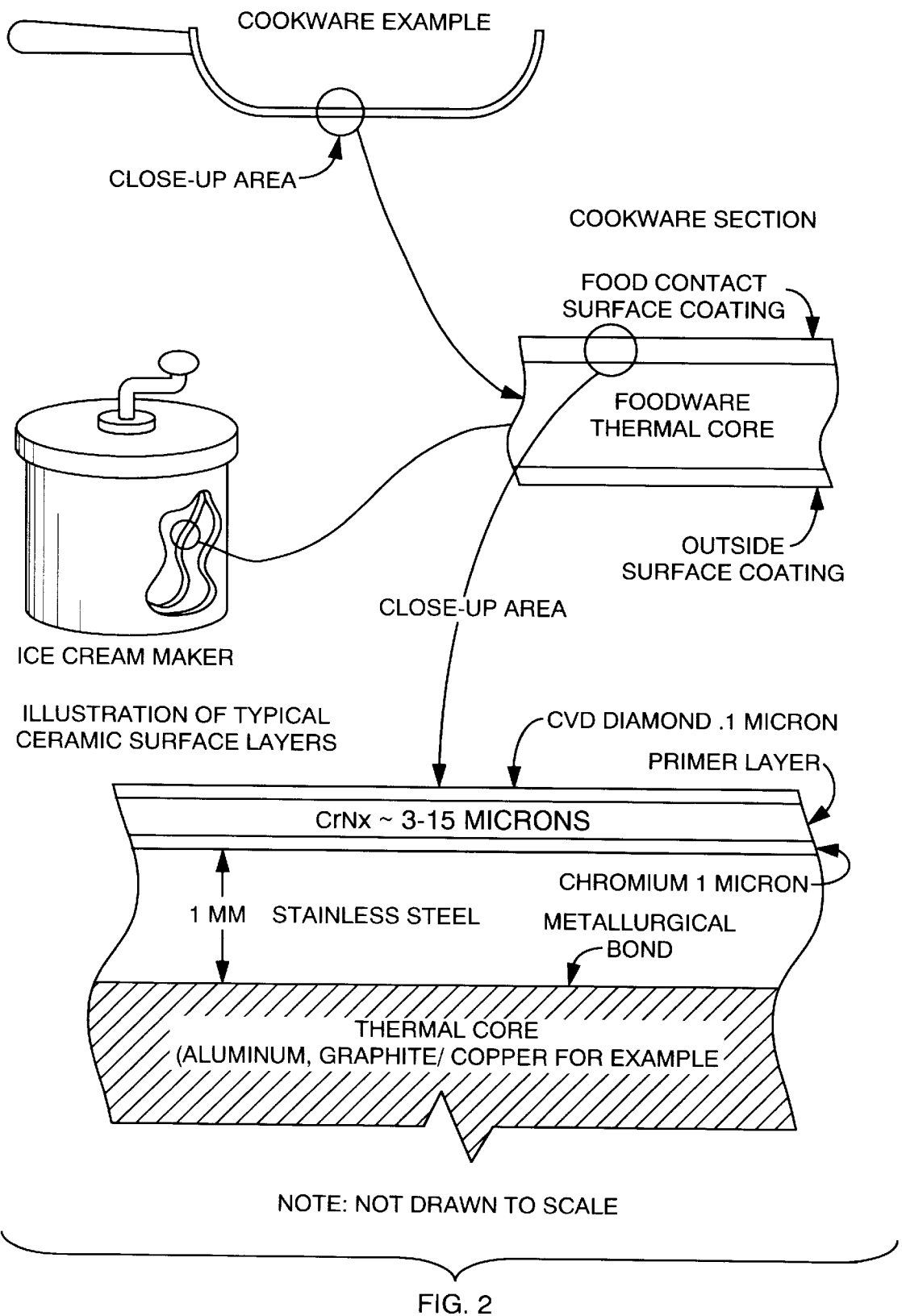
FIG. 2

Although specific features of this invention are illustrated in FIG. 2 and not others, the features may be combined as would be apparent to one of skill in the field.

Other embodiments will occur to those skilled in the art, and are within the scope of the following claims.

What is claimed is:

1. An article of foodware with non-stick properties and improved adhesion and corrosion resistance of the ceramic coating, comprising:
   a metal foodware article;
   a first primer layer consisting of chromium metal over at least a portion of said foodware; and
   a second layer of chromium nitride over at least a portion of said first primer layer.

2. The foodware article of claim 1, further including a third layer of a nitride or carbide ceramic over at least a portion of said second layer.

3. The foodware article of claim 1, further including a non-stick, hydrophobic diamond film deposited by plasma-assisted CVD.

4. An article of foodware with improved surface toughness comprising:
   a substrate foodware article of which at least the outer shell is composed of a metal;
   a first primer layer consisting of chromium metal over at least a portion of said substrate;
   a second layer of chromium nitride over at least a portion of said primer layer;
   repeated layers of chromium metal followed by chromium nitride over said second layer, such that the alternating chromium/chromium nitride layers in total are at least 3 microns thick.

5. The foodware article of claim 4, further including a topcoat layer or layers of a nitride or carbide ceramic over said repeated layers.

6. An article of foodware with non-stick properties and improved economics of manufacturing, and with decreased tendency towards delamination comprising:
   an aluminum alloy foodware article;
   a plasma-sprayed aluminum alloy substrate over at least a portion of said foodware article, having an outermost layer consisting of chromium or a high-chromium alloy;
   a PVD chromium layer over said substrate; and
   a PVD chromium nitride layer over said chromium layer.

7. The foodware article of claim 6, further including one or more topcoat layers of nitride or carbide ceramic over said chromium nitride layer.

8. The foodware article of claim 6, further including an electroplated chromium layer over said substrate, and below said PVD chromium layer.

* * * * *